United States Patent [19]

Stromswold

[11] Patent Number: 4,688,003

[45] Date of Patent: Aug. 18, 1987

[54] FEED-FORWARD ERROR CORRECTION FOR SANDAPS AND OTHER PHASE-LOCKED LOOPS

[75] Inventor: Chester E. Stromswold, Nashua, N.H.

[73] Assignee: Sanders Associates, Inc., Nashua, N.H.

[21] Appl. No.: 914,897

[22] Filed: Oct. 3, 1986

[51] Int. Cl.⁴ .............................................. H03L 7/00
[52] U.S. Cl. ....................................... 331/25; 328/155
[58] Field of Search ............................... 331/10, 17, 25; 329/155, 122, 124; 375/120; 455/260

[56] References Cited

U.S. PATENT DOCUMENTS 2,930,001  3/1960  Salmet ............................. 331/19 X

OTHER PUBLICATIONS

Omachi et al., A Digital Phase-Locked Loop Using Injection Locking Technique, Electronics and Communications in Japan, vol. 59-A, No. 6, Jun. 1976, pp. 27–36.

Primary Examiner—Eugene R. LaRoche
Assistant Examiner—Robert J. Pascal
Attorney, Agent, or Firm—Richard I. Seligman

[57] ABSTRACT

A signal source in the general form of a phase-locked loop (12, 20, 22, and 24) has its output fed to a phase modulator (32) controlled in response to the output of the phase-locked-loop phase detector (20). This provides feed-forward error correction that gives the signal source a faster response than a conventional phase-locked-loop arrangement would have.

6 Claims, 3 Drawing Figures

FEED-FORWARD ERROR CORRECTION FOR SANDAPS AND OTHER PHASE-LOCKED LOOPS

BACKGROUND OF THE INVENTION

The present invention is directed to phase-locked loops and other circuitry for generating an output signal that has a predetermined phase relationship with an input reference. It is directed particularly to speeding the response of such circuits.

The phase-locked loop is a circuit that has many applications and is accordingly arranged in various ways. The basic purpose of a phase-locked loop is always the same, however, namely to maintain a predetermined phase relationship between its output, which is typically generated by a voltage-controlled oscillator, and a reference signal. The reference signal may be an information-bearing signal received from an outside source. It may also be a local crystal reference.

The simplest phase relationship between the reference and the output is that they have the same phase and frequency. A phase-locked loop of this type typically is used as a filter; it "locks on" to a received signal component in the expected frequency range and reproduces the phase-modulation information in the received signal without forwarding much of the accompanying noise.

A slightly more complicated phase relationship between input and output is usually encountered in phase-locked loops used as frequency synthesizers. For instance, the predetermined phase relationship may be that a subharmonic of the output frequency is to remain in phase with the reference. In this type of an arrangement, the error signal that controls the voltage-controlled oscillator is produced by comparing to the phase of the reference signal the phase of subharmonic signal produced by applying the output of the voltage-controlled oscillator to a frequency divider.

A further complication in phase relationship occurs in the sandap, which is essentially a phase-locked loop but differs from conventional phase-locked loops in that its output is a signal that repeatedly sweeps in frequency. The phase relationship is that the output starts every sweep at the same phase with respect to a constant-frequency reference signal, and the phase relationships that obtain between the output and reference signals throughout the sweep are the same for every sweep. This keeps the output frequency a linear function of time and synchronizes the output signal with other circuitry that is generated from the same reference signal.

In both sandaps and other phase-locked loops, a representation of the output signal, such as the signal itself or a subharmonic, is compared in phase with the reference signal, and the resultant error signal is filtered to produce a control signal for the voltage-controlled (and, in the case of a sandap, chirped) oscillator. This feedback results in very accurate steady-state phase tracking. However, stability considerations dictate limitations on the gain of the feedback loop, so such circuits tend not to respond quickly to sudden errors.

An object of the present invention is therefore to speed the response of sandaps and other phase-locked loops without compromising their stability.

SUMMARY OF THE INVENTION

According to the present invention, the output signal is the output of a phase-modulating circuit whose input is the output of a voltage-controlled oscillator. The phase modulator modulates the VCO output in accordance with an error signal that represents the deviation of the voltage-controlled-oscillator output from the phase relationship that it should have to the reference signal if the proper phase relationship of the output signal to the reference phase relationship of the output signal to the reference signal is to result. Since the output of the voltage-controlled oscillator, rather than of the modulating circuit, is used for feedback, the gain used in applying the error signal to the phase modulator can be set for maximum speed and accuracy without regard to stability considerations. As a result, the sandap or other phase-locked loop can be made to have a response that is faster than that of conventional circuits of those types.

BRIEF DESCRIPTION OF THE DRAWINGS

These and further features and advantages of the present invention are described in connection with the accompanying drawings, in which.

DETAILED DESCRIPTION OF AN ILLUSTRATIVE EMBODIMENT

Figure 1:
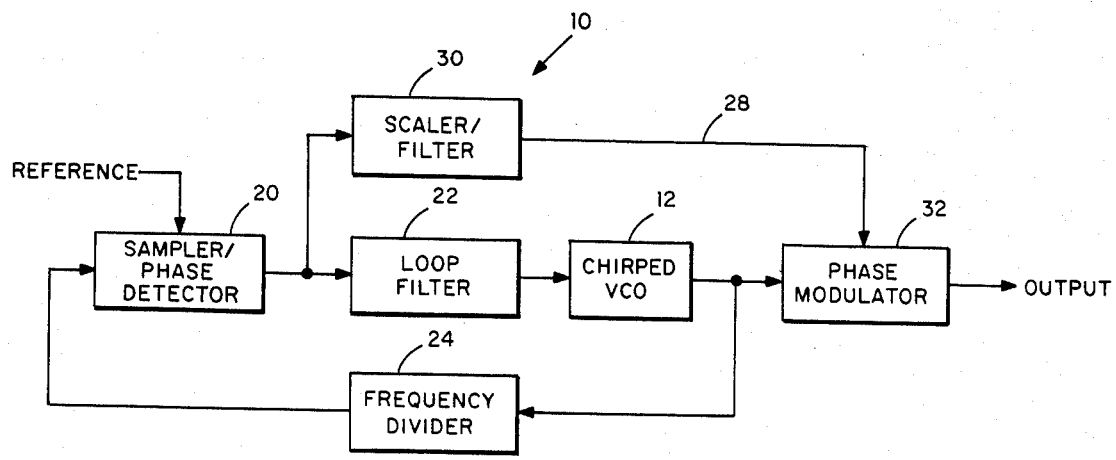
FIG. 1 is a block diagram of one embodiment of the present invention.

The signal source 10 of FIG. 1 is an example of the type of circuit that can employ the present invention. It is a circuit for generating an output that maintains a predetermined phase relationship with a reference input. The embodiment described specifically in FIG. 1 is a sandap, a circuit whose output frequency is repeatedly swept in a linear fashion; that is, a plot of output frequency as a function of time has a sawtooth shape.

The sandap receives a constant-frequency reference signal as its input, and it insures that the phase relationships that its chirped output has to the reference signal throughout a given sweep are the same as those that its output has throughout all other sweeps. The sandap also insures that the relationship of frequency to time is highly linear.

Figure 2:
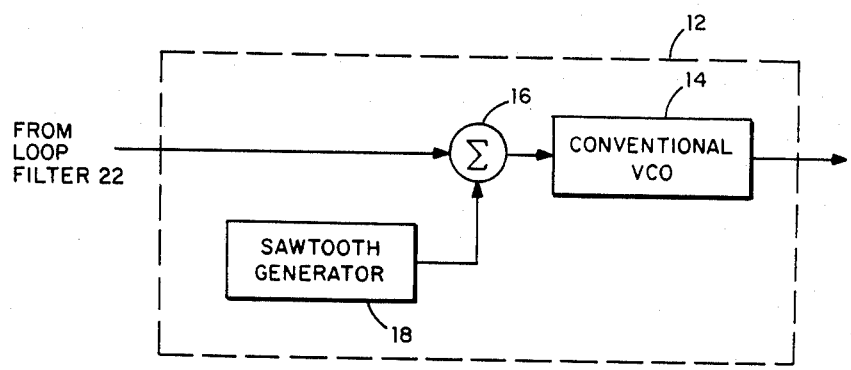
FIG. 2 is a block diagram of one embodiment of the voltage-controlled oscillator included in the arrangement of FIG. 1.

The embodiment of FIG. 1 includes a chirped voltage-controlled oscillator 12, which is shown in more detail in FIG. 2. The chirped voltage-controlled oscillator 12 includes a conventional voltage-controlled oscillator 14, for which the output frequency is a substantially time-independent function of input voltage. The input to the conventional voltage-controlled oscillator 14 is the output of an analog summation circuit 16, which receives as one input the output of a sawtooth generator 18. The input to the chirped voltage-controlled oscillator 12 is the other input to the summation circuit 16. Since one of the components of the input to the conventional voltage-controlled oscillator 14 is the output of sawtooth generator 18, the frequency of voltage-controlled oscillator 14 is swept in a sawtooth manner. The other input of the summing circuit 16 adjusts this sawtooth relationship to increase its linearity.

The circuit in FIG. 1 further includes a sampler/phase detector 20 and a loop filter 22, which form a phase-locked loop with the chirped voltage-controlled oscillator 12. The phase detector 20 receives a reference signal as one input. Its other input is the output of the chirped voltage-controlled oscillator 12. The sampler/phase detector 20 generates an output that represents the deviation from a predetermined phase relationship between those two signals. It produces this output by sampling the output of the chirped voltage-controlled oscillator 12. Specifically, the frequency of the reference signal equals the square root of the sweep rate of the chirp signal, and if its positive-going (or negative-going) zero crossings initially coincide with the zero crossings of the chirped signal, this relationship will be maintained throughout the sweep if the frequency-versus-time function of the chirp signal remains precisely linear. It is therefore possible to determine the deviation of the chirp signal at the positive-going zero crossings of the reference signal. This is the function that the sampler/phase detector 20 performs, and its output is a low-pass-filtered version of the resultant sample signal.

A variable frequency divider 24 can be used to divide the frequency of the chirp signal by different integers and thereby achieve different sweep rates from the same reference signal.

If the chirped voltage-controlled oscillator produces an output that has zero crossings occuring at the same times as those of the reference signal, the output of phase detector 20 is zero, and no adjustment voltage is thereby applied to the summation circuit 16 of FIG. 2. The conventional voltage-controlled oscillator 14 is thus controlled exclusively by the output of the sawtooth generator 18. If the zero crossings of the chirp signal do not occur exactly on the zero crossings of the reference signal, on the other hand, phase detector 20 produces a non-zero output, which it applies to the loop filter 22. Filter 22 may be a filter of the type conventionally used in phase-locked loops to achieve zero error while maintaining stability. The loop filter 22 applies its output to the summation circuit 16, which adds it to the output of the sawtooth generator 18 and thereby adjusts the frequency of the conventional voltage-controlled oscillator so as to reduce the phase error. In this way, the deviation of the chirped signal from the predetermined phase relationship with the reference signal is driven to zero. On a steady-state basis, therefore, the frequency sweep of the chirp signal is kept linear and in synchronism with other parts of the circuit that receive the reference signal.

The parts of the circuit described so far operate as a conventional sandap. Such a circuit is limited in the speed at which it can respond to sudden error sources. If the sawtooth generator has a significant deviation from linearity in a particular part of its sweep, or if the voltage-controlled oscillator has a corresponding non-linearity in a particular part of its range, or if noise occurs, there is a sudden error. But stability considerations impose a limit on the gain of the loop filter 22 and thus on the speed with which the parts described so far can correct the error.

In accordance with the present invention, the speed of response is greatly increased through the use of a feed-forward path 28 in which a scaler/filter 30 is interposed. The scaler/filter 30 receives the output of the phase detector 20, scales and filters it, and applies the result to a phase modulator 32 to control its phase modulation of the output of the chirped voltage-controlled oscillator 12.

Phase modulator 30 may simply be a device for changing only the phase of a received signal. It may alternatively include further circuitry for translating the received signal in frequency as well, because to do so would provide an advantage described below in connection with FIG. 3.

In either event, the scaler 30 applies a signal to the phase modulator 32 of such a magnitude that the phase change that it commands is equal to the phase error indicated by the output of the phase detector 20. That is, the scaling provided by the scaler/filter 30 is such as to provide unity gain between the phase detector 20 and the phase modulator 32 in the feed-forward path 28. This gain is set without concern for stability considerations, since there is no feedback signal from the phase modulator. The filtering performed by scaler/filter 30 has as its purpose only the elimination of, for instance, unwanted error-signal components at the reference frequency; since there is no feedback from the phase modulator, the scaler/filter does not additionally need to provide attenuation in frequency ranges that would otherwise produce instability.

In operation, if the output of circuit 10 has exactly the predetermined, linear-sweep phase relationship with the reference signal, the output of the phase detector 20 is zero, while the loop filter 22, which typically includes an integration component, may be applying a non-zero signal to summation circuit 16. However, the scaler/filter 30 has no significant integration component and so applies a zero signal to the phase modulator 32. As a result, the output of the phase modulator 32 is essentially equal to the output of the chirped voltage-controlled oscillator 12.

Now suppose an error suddenly develops in the output of the chirped voltage-controlled oscillator 12. A sudden non-zero output of the phase detector 20 accordingly appears, but the response of the loop filter 22 does not bring the chirped voltage-controlled oscillator 12 immediately into the proper phase relationship with the reference signal. As a result, the output of the chirped voltage-controlled oscillator 12 retains a deviation from the desired phase relationship for a significant settling time.

According to the present invention, however, the largest part of this deviation is quickly eliminated in the phase-modulator output because the output of the phase detector 20, which represents the detected phase deviation, is applied by the scaler/filter 30 with substantially unity gain and very little delay to the phase modulator 32. If scaler/filter 30 had exactly unity gain and no delay, there would be no output error at all. Scaler/filter 30 does have some delay, of course, and since it uses no feedback, it typically does not have the steady-state accuracy of the feedback section of the circuit. But it does provide a fast, interim reduction of the phase error while the transients in the feedback loop are settling. In this way, the high steady-state accuracy of a feedback circuit is obtained as well as a speed that is higher than that ordinarily obtained with feedback circuitry.

Figure 3:
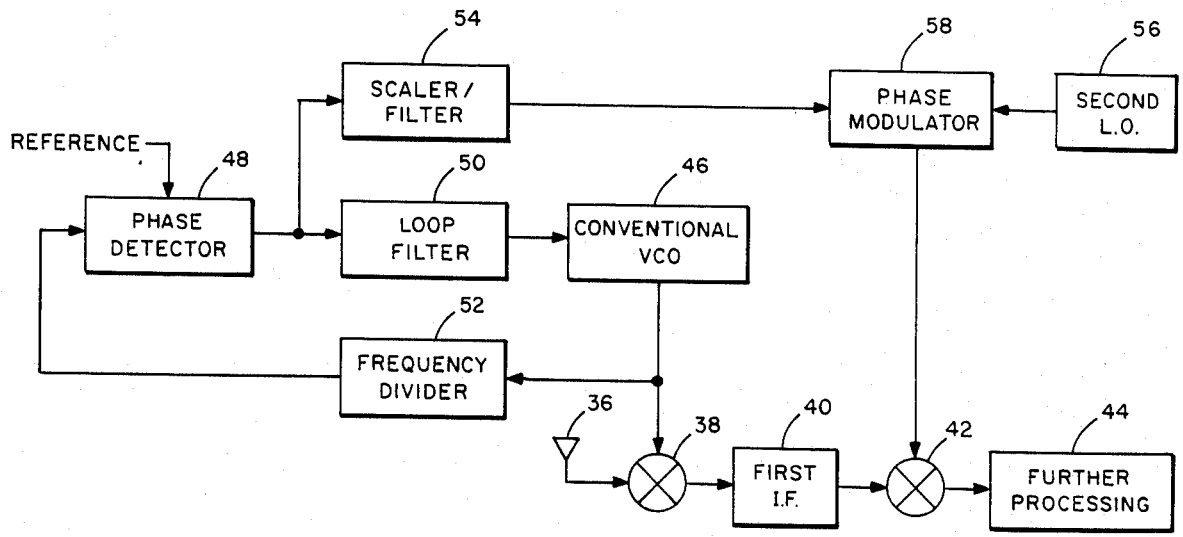
FIG. 3 is a block diagram of another embodiment of the present invention.

Another embodiment of the present invention is depicted in FIG. 3, in which the phase-locked loop incorporates parts of a receiver with which it is used as a local oscillator. The receiver includes an antenna 36, a first mixer 38, a first intermediate-frequency filter and amplifier 40, a second mixer 42, and subsequent processing circuitry 44, typically including a second intermediate-frequency section and some type of detection circuitry.

A receiver of this type—i.e., one that includes two intermediate-frequency sections—conventionally includes two local oscillators. The phase-locked loop depicted in FIG. 3 is used instead of one of them. Rather than simply replacing the local oscillator, however, the phase-locked loop in the FIG. 3 embodiment saves parts by incorporating the first intermediate-frequency section and the second local oscillator in a composite frequency-translation circuit.

The phase-locked loop includes a voltage-controlled oscillator 46. As was explained in conneciton with FIGS. 1 and 2, voltage-controlled oscillator 46 could be a chirped voltage-controlled oscillator, but we will assume in the case of FIG. 3 that it is a voltage-controlled oscillator of the conventional type which has an essentially time-independent relationship of frequency to voltage. The phase detector 48, loop filter 50, frequency divider 52, and scaler/filter 54 all perform functions equivalent to those performed by the corresponding elements 20, 22, 24, and 30 of FIG. 1. Unlike the simple phase modulator 32 of FIG. 1, however, the phase-modulation circuitry in the arrangement of FIG. 3 additionally translates its input in frequency. It includes the receiver's fixed second local oscillator 56, a simple phase modulator 58, the two mixers 38 and 42, and the first intermediate-frequency section 40.

Rather than modulate the output of the voltage-controlled oscillator 46 directly, the phase modulator 58 modulates the output of the fixed local oscillator 56 in response to the output of the scaler/filter 54. In comparison with the phase modulator 32 of FIG. 1, therefore, phase modulator 58 can be simpler since it only has to operate at a single frequency, namely that of local oscillator 56. Phase modulator 58 applies the resultant signal to mixer 42, which frequency translates the output of the first intermediate-frequency section 40. That is, the phase control is distributed. The feedback error correction is performed on the signal applied to mixer 38, while the feed-forward error correction is applied in mixer 42. The operation of the phase-locked loop of FIG. 3 is nonetheless the same in principle as that of the sandap of FIG. 1. It therefore provides the same advantages.

From the foregoing description, it is apparent that circuitry that follows the teachings of the present invention provides the steady-state signal accuracy ordinarily associated with phase-locked loops but has a response significantly faster than the response of such circuits of the conventional type. The present invention thus constitutes a significant advance in the art.

I claim:

1. For generating an apparatus output signal having a desired output phase relationship with a reference signal, an apparatus comprising:
  A. a voltage-controlled oscillator, adapted for reception of a control signal, for generating a VCO output signal whose frequency is dependent upon the control signal;
  B. an error detector for determining the deviation of the VCO output from a predetermined intermediate phase relationship with the received reference signal and for generating an error signal representing the deviation;
  C. a loop filter connected to receive the error signal and apply a filtered version thereof as the control signal to the voltage-controlled oscillator so as to reduce the departure of the VCO output from the predetermined intermediate phase relationship with the received reference signal; and
  D. a phase-modulation circuit connected for reception of the error signal and the VCO output for generating an apparatus output whose phase relationship to the VCO output is modulated in accordance with the error signal such that the apparatus output bears substantially the desired output phase relationship to the reference signal when the error signal indicates that the VCO output bears the predetermined intermediate phase relationship to the reference signal and such that the phase relationship between the apparatus output and the VCO output changes to reduce the deviation of the apparatus output from the desired output phase relationship with the reference signal when the error signal indicates that the VCO does not bear the predetermined intermediate phase relationship to the reference signal.

2. An apparatus as recited in claim 1 wherein the voltage-controlled oscillator is a chirped oscillator whose output frequency is repeatedly swept in time and in which the relationship of output frequency to time within a sweep is determined by the control signal applied thereto.

3. An apparatus as recited in claim 2 wherein the error detector comprises means for generating the error signal by sampling the VCO output on zero crossings of the reference signal.

4. An apparatus as recited in claim 1 wherein the output of the voltage-controlled oscillator is substantially time-independent but is dependent on the control signal applied to the voltage-controlled oscillator.

5. An apparatus as recited in claim 1 wherein the phase-modulation circuit includes:
  A. a feed forward filter for generating a feed-forward signal by filtering the error signal; and
  B. a phase modulator for phase modulating the VCO output in accordance with the feed-forward signal.

6. An apparatus as recited in claim 1 wherein the desired phase relationship is a predetermined phase relationship with the reference signal and a receiver input signal and wherein the phase-modulation circuit includes:
  A. a fixed-frequency local oscillator for generating a fixed-frequency signal;
  B. a feed-forward filter for generating a feed-forward signal by filtering the error signal;
  C. a phase modulator for modulating the fixed-frequency signal in accordance with the feed-forward signal to produce a modulator output;
  D. a first frequency translator, adapted for reception of the receiver input signal, for translating the translator input signal in frequency and phase by the frequency and phase of the VCO output to produce a first-translator output: and
  E. a second frequency translator for translating the first-translator output in frequency and phase by the frequency and phase of the modulator output to produce the apparatus output.

* * * * *